United States Patent [19]

Delagebeaudeuf et al.

[11] Patent Number: 4,974,038
[45] Date of Patent: Nov. 27, 1990

[54] MICROWAVE TRANSISTOR WITH DOUBLE HETEROJUNCTION

[75] Inventors: Daniel Delagebeaudeuf, Saclay; Pierre Gibeau, Voisins le Bretonneux; Francoise Rambier, Orsay; Jean J. Godard, Boulogne, all of France

[73] Assignee: Thomson Hybrides et Microondes, Paris, France

[21] Appl. No.: 228,167

[22] Filed: Aug. 4, 1988

[30] Foreign Application Priority Data

Aug. 5, 1987 [FR] France ............... 87 11144

[51] Int. Cl.$^5$ ............ H01L 29/205; H01L 29/80
[52] U.S. Cl. ..................... 357/22; 357/16; 357/4; 357/42
[58] Field of Search ............ 357/42, 16, 22, 16, 357/22, 4; 307/452; 377/47

[56] References Cited

U.S. PATENT DOCUMENTS

| 4,328,484 | 5/1982 | Denecke | 377/47 |
| 4,556,895 | 12/1985 | Ohata | 357/22 |
| 4,603,469 | 8/1986 | Armiento | 357/22 |
| 4,743,951 | 5/1988 | Chang | 357/22 |
| 4,748,484 | 5/1988 | Takakawa | 357/16 |
| 4,791,072 | 12/1988 | Kiel | 357/42 |
| 4,835,581 | 5/1989 | Kuroda et al. | 357/16 |

FOREIGN PATENT DOCUMENTS

| 0067721 | 12/1982 | European Pat. Off. | 357/22 |
| 61-147577 | 7/1986 | Japan | 357/22 |
| 61-159770 | 7/1986 | Japan | 357/22 |
| 61-274369 | 12/1986 | Japan | 357/22 |
| 62-40778 | 2/1987 | Japan | |

OTHER PUBLICATIONS

Patent Abstracts of Japan, vol. 11, No. 224, (E-525)[2671], Jul. 21, 1987.
IEEE Transactions of Electron Devices, vol. ED-28, No. 7, Jul. 1981, pp. 790-795, D. Delagebeaudeuf et al., "Charge Control of the Heterojunction Two-Dimensional Electron Gas . . .".
IEEE Transactions on Electron Devices, vol. ED-29, No. 6, Jun. 1982, pp. 955-960, D. Delagebeaudeuf et al., Metal-(n)AlGaAs-GaAs Two-Dimensional Electron Gas FET.

Primary Examiner—Jerome Jackson, Jr.
Attorney, Agent, or Firm—Oblon, Spivak, McClelland, Maier & Neustadt

[57] ABSTRACT

A microwave transistor made with group III-V materials, such as GaAs and AlGaAs, is disclosed. This transistor essentially comprises a double heterojunction formed by a first layer of material with a big forbidden gap, n doped for example, a second non-doped layer with a narrow forbidden gap and a third p doped layer with a wide forbidden gap. Under the effect of the electrical field, there may be formed, simultaneously or not simultaneously, in the second layer, a two-dimensional electron gas at the interface with the first layer and a two-dimensional hole gas at the interface with the third layer. By bringing the thickness of the layers into play, the characteristics of the n and p channels can be made symmetrical.

10 Claims, 2 Drawing Sheets

MICROWAVE TRANSISTOR WITH DOUBLE HETEROJUNCTION

BACKGROUND OF THE INVENTION

1. Field of the Invention

The present invention concerns a field effect transistor made of materials of the III–V group such as GaAs and AlGaAs, having a double heterojunction. Each heterojunction is made so that a two-dimensional gas of charge carriers can appear at the interface, but the types of doping of the semi-conducting material layers (n and p) forming these heterojunctions are chosen so that the transistor has an n channel and a p channel which are used simultaneously or individually.

2. Description of the Prior Art

Field-effect transistors of the TEGFET (two-dimensional electron gas field effect transistor) type are now well known, and their theory was established in 1979. These transistors consist essentially of a heterojunction between a material with a small forbidden gap, GaAs for example, which is non-intentionally doped (NID) or weakly n doped or p doped, and a material with a wide forbidden gap, AlGaAs for example, which is n type doped. Under certain conditions (such as the adaptation of the lattice parameters, the thickness of the layers, the doping levels, etc.), there appears a highly mobile two-dimensional electron gas with a heterojunction on the side of the material with a narrow forbidden gap.

These transistors generally use an n channel because the electrons are more mobile than the holes and hence more useful for working in microwave frequencies, namely at gigahertz.

However, to process AC signals or in complementary logic circuits (for example, an n channel transistor and a p channel transistor as in complementary MOS transistors) it is worthwhile to have a transistor that has both n and p characteristics.

This is what is proposed by the invention which combines two parallel channels in a single transistor. These are an n channel in which there is a two-dimensional electron gas and a p channel in which there is a two-dimensional hole gas. These two channels can coexist and work in turn or, depending on the value of the voltages applied and the nature of the contacts providing access to the said channels, they may be selected to choose one of the two channels.

Thus, the transistor according to the invention has a substrate and, if necessary, one or more buffer layers for adapting the lattice parameters. On this support, an active region consists of three layers of semi-conducting materials of the III–V group forming two heterojunctions between them, the intermediate layer having a small forbidden gap and being non-intentionally doped. The first and third layers are made of materials with wide forbidden gaps. One of them is n doped and the other is p doped at doping levels of the order of $10^{17} - 3.10^{18} at.cm^{-3}$, such that a two-dimensional electron gas can appear at a first heterojunction and a two-dimensional hole gas can appear at a second heterojunction.

SUMMARY OF THE INVENTION

More precisely, the invention consists of a double heterojunction microwave transistor comprising an active region, controlled by a Schottky gate electrode, supported by a substrate made of semi-insulating or non-intentionally doped semi-conducting materials, said transistor being characterized in that the active region comprises three superimposed layers, the intermediate layer being made of a non-intentionally doped semi-conducting material with a small forbidden gap, the adjacent layers being made of semi-conducting material with a wider forbidden gap than that of the intermediate layer, one of said adjacent layers being n type doped ($n_D \geq 10^{17} at.cm^{-3}$) and the other being p type doped ($n_A \geq 10^{17} at.cm^{-3}$), this first layer and third layer thus forming two heterojunctions at their interfaces with the second intermediate layer so that a two-dimensional electron gas is formed at the interface between the first n doped layer and the second non-intentionally doped layer and a two-dimensional hole gas is formed at the interface between the second non-intentionally doped layer and the third p doped layer, said transistor being thus provided with two potential conducting channels, one of the n type due to the two-dimensional electron gas and the other of the p type due to the two-dimensional hole gas, said potential conducting channels being in parallel between the source and drain regions.

BRIEF DESCRIPTION OF THE DRAWINGS

The invention will be better understood from the following more detailed description of the structure of the transistor and of two examples of its application, made with reference to the appended figures, of which.

DESCRIPTION OF PREFERRED EMBODIMENTS

The transistor according to the invention, which is essentially designed for microwave frequencies ranging between one and several tens of gigahertz, consists of fast materials of the III–V group some of which, such as GaAs, for example, have a small forbidden gap compared with others such as AlGaAs which have a wider forbidden gap.

In order to simplify the terms used and provide for an easier understanding of the text, we shall use the word "GaAs" rather than the phrase "semi-conducting material with small forbidden gap" and similarly the words "$Al_xGa_{1-x}As$" or "AlGaAs" rather than the phrase "semi-conducting material with big forbidden gap". This in no way restricts the scope of the invention and the transistor can be made with a great many binary, ternary or quaternary alloys III–V, the most common of which, apart from GaAs and AlGaAs, are InP, GaInAs, GaInAsP, etc.

Figure 1:
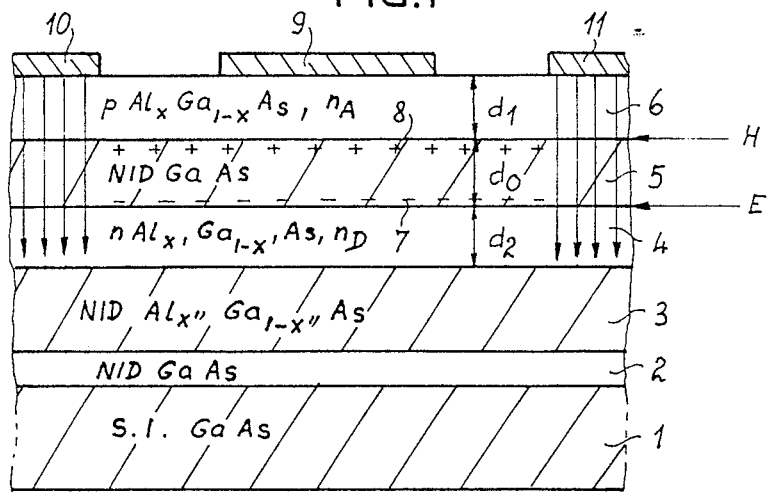
FIG. 1 shows a sectional view of a transistor according to the invention.

FIG. 1 shows a sectional view of a transistor according to the invention. Its substrate comprises a substrate 1 proper, made of semi-insulating GaAs and, very generally, one or two buffer layers 2 and 3. In the example shown, a first buffer layer 2 made of non-intentionally doped (NID) GaAs is used as a smoothing layer for the substrate 1 and a second buffer layer 3 made of NID $Al_{x''}Ga_{1-x''}As$ prevents the appearance of a second conducting channel (n channel).

The active layers consist of:

a first layer 4, made of $Al_{x'}Ga_{1-x'}As$ having a thickness of $d_2$ and being n type doped, for example, with a donor density level $n_D$ greater than $10^{17}$at.cm$^{-3}$.

a second intermediate layer 5 made of GaAs, with a thickness of $d_o$, non-intentionally doped i.e. it can be either weakly n doped or weakly p doped but with a level of impurities smaller than $10^{15}$at.cm$^{-3}$, a third layer 6 made of $Al_xGa_{1-x}As$ having a thickness $d_1$ and being p type doped in this case, with an acceptor density level $n_A$ greater than $10^{17}$at.cm$^{-3}$.

The third layer 6, made of AlGaAs and the second layer 5, which is adjacent to it, made of GaAs, form a heterojunction which shall be called a first heterojunction because it is at the surface, at the level H, while the second layer 5, made of GaAs and the first layer 4, which is adjacent to it and is made of AlGaAs, form another heterojunction which shall be called a second heterojunction because it is at a depth, at the level E.

The n and p types of doping of the first (4) and third (6) layers of AlGaAs may be reversed, but it shall be seen further below that this structure with the n layer buried and the p layer at the surface is more worthwhile.

If certain conditions of thicknesses, doping levels, forbidden gap sizes, etc. are fulfilled, the following may be formed under the effect of a voltage applied to the gate:

a two-dimensional electron gas 7 inside the second layer 5 of GaAs, near the heterojunction E with the first layer 4 of AlGaAs, a two-dimensional hole gas 8 inside the same second layer 5 of GaAs, near the heterojunction H with a third layer 6 of AlGaAs.

Thus, this transistor has two channels in parallel, one electron channel at 7 and the other hole channel at 8.

If the n and p types of doping of the two layers 4 and 6 of AlGaAs are inverted, the two-dimensional gases of the charge carriers are, of course, also inverted.

The transistor is finished by making three electrode metallizations, a gate electrode metallization 9, a source electrode metallization 10 and a drain electrode metallization 11 deposited on the surface of the last active layer 6.

Figure 2:
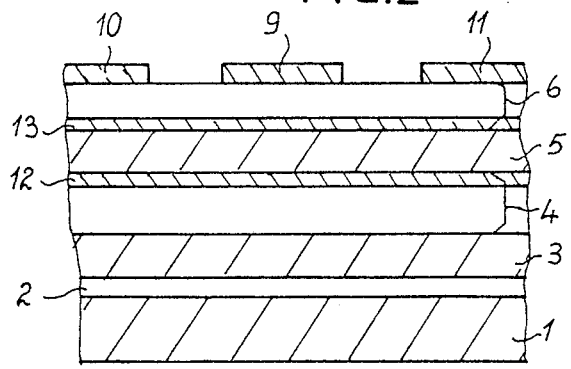
FIG. 2 shows an alternative embodiment of the transistor of the preceding figure.

FIG. 2 shows a sectional view of an alternative embodiment of the transistor of the preceding figure. According to this alternative, the first layer 4 of $Al_{x'}Ga_{1-x'}As$ has a thin sub-layer 12, which is made of the same material but is non-intentionally doped, in contact with the second layer 5 of NID GaAs. And the third layer 6 of $Al_xGa_{1-x}As$ also has a thin sub-layer 13, made of the same material but non-intentionally doped, in contact with the second layer 5 of NID GaAs. These two sub-layers 12 and 13, which are only a few tens of angstroms thick, are called spacers and their object is to move the two-dimensional gases of charge carriers 7 and 8 away from the doped layers 4 and 6 and to increase electronic mobility.

Various types of operation are possible for this transistor depending on the structural parameters, i.e. the doping levels $n_A$ and $n_D$, the thicknesses of the layers $d_0$, $d_1$, $d_2$, the gate-channel voltage $V_{gc}$ applied to the Schottky gate metallization 9. A simplified model of the device enables the computation of the threshold voltage of each of these two channels as well as, for each case, the sensitivity of the charge control. The simplification applied consists in assuming that:

the electrical permittivity $\epsilon$ values are the same for all the layers, for there is very little variation in E with the aluminium content of AlGaAs;

the thickness of the two-dimensional electron gas (2DEG) layers and two-dimensional hole gas (2DHG) layers is overlooked. Although these layers have an infinitesimal thickness, this approximation gives an accurate estimate of the threshold voltages;

there are no spacers 12 and 13.

Let:

$\phi_N$: height of semi-conductor/metal barrier (for the electrons) at the metal/p-doped $Al_xGa_{1-x}As$ (layer 6) interface, $\Delta E_c$: energy discontinuity of the conduction band at the interfaces 1(H) and 2(E) (assuming for simplicity's sake that $x=x'=x'=x''$)

$$V_{p1} = \frac{qn_Ad_1^2}{2\epsilon},$$

wherein q is the electron charge. $V_{p1}$ is homogeneous at a so-called penetration voltage.

$E_{gGaAs}$ is the forbidden gap for GaAs($\simeq$1.4 eV)

$|\epsilon 2|$ is the absolute value of the electrical field at the interface 2, substantially constant, i.e. hardly dependent on the gate-channel voltage $V_{gc}$.

The theory of two-dimensional electron gas transistors or TEGFETs has been established by D. Delagebeaudeuf and Nuyen T. Linh in two articles published in IEEE Transactions on Electron Devices, the former in Vol. ED 28, No. 7, pp. 790–795, July 1981 and the latter in Vol. ED 29, No. 6, pp. 955–960, June 1982. In extrapolating this theory to the structure of the transistor according to the invention, we get for the (2DHG) p channel:

a threshold voltage $V_{Tp}$ defined by:

Equation (1)

$$V_{TP} \simeq \phi_n - \Delta E_c + V_{p1} - E_g\,Ga\,As\left(1 + \frac{d_1}{d_o}\right)$$

a sensitivity of the charge control of this p channel defined by

Equation (2)

$$\frac{dp_s}{dV_{gc}} \simeq -\frac{\epsilon}{qd_1}$$

where $p_s$=surface density of the holes. Similarly, for the (2DEG) n channel, we get:

a threshold voltage $V_{Tn}$

Equation (3)

$$V_{Tn} \simeq \phi_n - \Delta E_c + V_{p1} - |\xi 2|(d_0 + d_1)$$

and a sensitivity of the charge control in the n channel

Equation (4)

$$\frac{dn_s}{dV_{gc}} \simeq \frac{\epsilon}{q(d_o + d_1)}$$

where $n_s$=surface density of electrons.

Two cases have to be considered depending on the relative values of the threshold voltages $V_T$ of the two channels.

In the first case, $$\text{if } V_{Tn} < V_{Tp} \text{ giving } |\xi 2| > \frac{E_g \, Ga \, As}{d_o}$$

there is a (2DEG) n channel called a "residual" channel not controlled by the gate for any gate-channel voltage $V_{gc}$ smaller than the threshold voltage of the p channel:

$$V_{gc} < V_{Tp}$$

Figure 3:
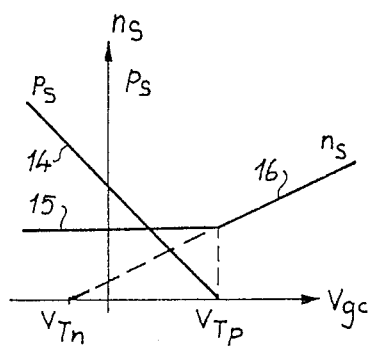
FIGS. 3 and 4 are graphs indicating the existence of the n and p channels in two examples of threshold voltages of the channels.

This is what is shown in FIG. 3 where the surface densities $n_s$ and $p_s$ are put on the y axis and the gate-channel voltage $V_{gc}$ is on put the x axis. Since the threshold voltage $V_{Tn}$ is smaller than the threshold voltage $V_{Tp}$, for any gate voltage $V_{gc} < V_{Tp}$, the channel p is controlled since the hole surface density $p_s$ is controlled, according to the straight line 14, but the channel n is not controlled because the electron surface density $n_s$ remains constant along the straight line 15. For any gate voltage $V_{gc} > V_{Tp}$, the n channel is controlled as a function of the straight line 16. In the latter case, $$\text{if } V_{Tn} > V_{Tp} \text{ giving } |\xi 2| < \frac{E_g \, Ga \, As}{d_o}$$

the "residual" n channel, not controlled by the gate, no longer exists. But there exists a gate voltage $V_{gc}$ zone, located between the two threshold voltages $V_{Tn}$ and $V_{Tp}$, in which the gate no longer has any effect on the transistor: it is off.

Figure 4:
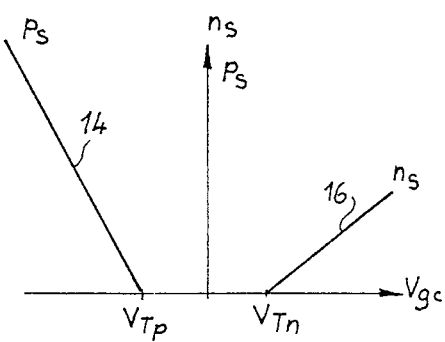

This second case is shown in FIG. 4 which repeats the same elements as FIG. 3 but shows them as adapted to the relative values of the threshold voltages.

In these two figures, the slope of the straight line 14 representing the hole surface density is greater than the slope of the straight line 16 representing the electron surface density: in accordance with the equations (2) and (4), it is seen that the control sensitivity of the (2DEG) n channel is weaker than the control sensitivity of the (2DEG) p channel. This can be easily understood: in the chosen structure, the (2DEG) n channel is further away from the gate than the (2DHG) p channel. The electrons are therefore further than the holes from the control gate.

If, on the contrary, it had been decided to have a p doped buried layer 4 and an n doped surface layer 6, the same line of reasoning would be adapted in reverse and there would be a surface n channel control sensitivity greater than the buried p channel control sensitivity.

However, it is more worthwhile to preserve the structure as chosen in FIG. 1. This makes it possible to balance and give symmetry to the characteristics of the two channels of the transistor because the distancing of the n channel counter-balances the greater speed of the electrons as compared with the holes which are closer to the gate. Thus, the characteristics of the transistor can be symmetrized by bringing into play the relative distances of the two channels, n and p, hence, by bringing into play the thicknesses $d_0$, $d_1$, $d_2$ of the layers.

It has been assumed until now that there is no spacer 12 and 13. If there is a spacer 12, at the interface of the n AlGaAs—GaAs layers 14 and 15, and if its thickness is e, an approximate expression of the electrical field $|\xi 2|$, resulting from the modelling of the TEGFET structures given in the two publications referred to, is given by the equation:

Equation (5)

$$|\xi 2| \simeq \frac{q}{\epsilon}\left(\sqrt{\frac{2\epsilon n_D}{q}\Delta E_c + (n_D e)^2} - n_D e\right)$$

In this expression, the infinitesimal thickness of the two-dimensional layer (2DEG) has been overlooked as in all the previous computations. If it is desired to take the thickness of the two-dimensional layer into account, a more precise study leads to the replacing of e by $e + 80\text{Å}$ (approximately) in the equation (5) 80Å corresponding to the width of the 2DEG layer. The electrical field $|\xi 2|$ is therefore a function of $n_D$, $\Delta E_c$, hence of $x'$ in $Al_{x'}Ga_{1-x'}As$ and of e, and it can be adjusted between two limits which are approximately:

Equation (6)

$$3.10^6 V.m^{-1} \lesssim |\xi 2| \lesssim 2.10^7 V.m^{-1}$$

in such a way that, in view of the wide range of choice with respect to the other structural parameters, it is possible to make transistors having varied characteristics for varied applications.

However, a value of the electrical field $|\xi 2|$ having been defined for a given application or having been imposed by it, it is preferable to fix the thickness $D_2$ of the n $Al_{x'}Ga_{1-x'}As$ layer 4 so that this layer is completely depleted in order to eliminate any unwanted conduction by electrons in this layer. This condition is fulfilled for:

Equation (7)

$$d_{2opt} \simeq \frac{\epsilon|\xi 2|}{qn_D}$$

Figure 5:
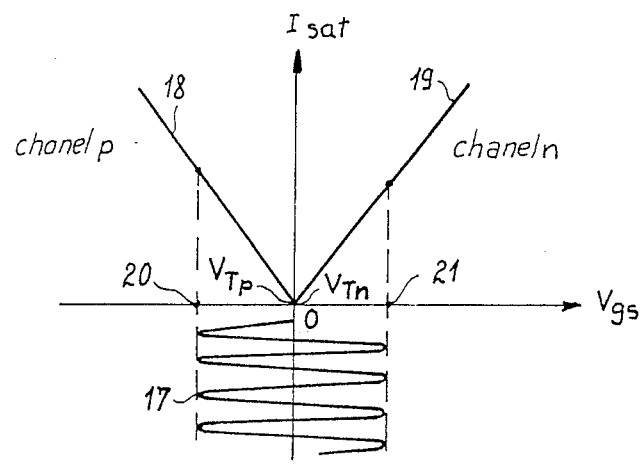
FIG. 5 is a graph indicating the existence of channels for a transistor working as a frequency doubler.

A frequency doubling transistor with gain constitutes a first example of an application of the double heterojunction transistor according to the invention. To this end, an alternating signal 17 is applied to the gate of the transistor, for which the DC bias voltage $V_{gs} = 0$. FIG. 5 makes it easy to understand the working of the transistor as a doubler: it shows the variation in the transconductance values 18 of the p channel and 19 of the n channel. If the transconductance values at $V_{gs} < 0$ and at $V_{gs} > 0$ are equal in absolute terms, the alternating signal 17 applied to the gate is rectified with two alternations on the drain. Its negative phase biases the gate at a point 20, and the p channel (2DHG) is conductive, its positive phase biases the gate at a point 21 and the n channel (2DEG) is conductive. The output frequency is therefore twice the frequency of the input frequency and the fundamental mode is extracted by filtering. But the gain of the transistor is also made use of.

There are three conditions for a double heterojunction transistor to be suited to this application of a frequency doubler with gain.

The first condition is that the contacts of the source and drain regions should be ohmic with respect to the n and p channels. This condition can be met by making the corresponding metallizations 10 and 11 with alloyed ohmic contacts which diffuse in the layers of semi-conducting materials. This is what is shown in FIG. 1 by arrows which penetrate the active layers 4, 5 and 6.

The second condition is that the transconductance values in $V_{gc}<0$ and $V_{gc}>0$ modes should be equal and opposite in absolute terms. A transconductance value is the product of a charge density and the speed of the charge carriers. For a sub-micronic gate, the carriers move at their limit speed, $v_{Ln}$ in the channel n, $v_{Lp}$ in the channel p and the transconductance gm for an n channel with a width Z is given by the relationship:

Equation (8)

$$gm = qZv_{Ln}\frac{dn_s}{dV_{gc}}$$

For the transconductance values to be equal and opposite in terms of absolute value, we should therefore have:

$$v_{Ln}\frac{dn_s}{dV_{gc}} = v_{Lp}\left|\frac{dp_s}{dV_{gc}}\right|$$

that is, according to the equations (2) and (4)

$$\frac{d_o}{d_1} = \frac{v_{Ln}}{v_{Lp}} - 1$$

For GaAs (the material in which the two two-dimensional gases 2DEG and 2DHG move), we get:

$$v_{Ln} \simeq 2v_{Lp}$$

leading to a choice of $d_0 \simeq d_1$ so that the transconductance values are equal in absolute terms.

The usefulness of the double heterojunction structure is therefore that it can provide symmetry to the operations of the transistor in n channel mode or p channel mode by bringing into play solely the thicknesses of the layers of semi-conducting materials.

The third condition is that:

$$V_{Tn} \simeq V_{Tp} \simeq 0$$

$V_{Tp}$ and $V_{Tn}$ were defined by the equations (1) and (3) respectively and it is assumed, to simplify the explanation, that:

$$V_0 = \phi_n - \Delta E_c + V_{pl}$$

If both threshold voltages are nil, we deduce from (1) and (3), in keeping the second condition $d_0 \simeq d_1$ that:

$$|\xi_2| \simeq \frac{E_g\,Ga\,As}{d_o}$$

that is, $V_0 \simeq 2E_{g\,GaAs} = 2.8$ eV.

As an application, we may choose $x = x' = x'' = 0.3$, which is a standard value. The literature on the subject then gives $\phi_n \simeq 1$ and $\Delta/E_c \simeq 0.3$, whence $V_{pl} \simeq 2$ volts, which can be achieved with $n_A = 3.10^{17}$ at.cm$^{-3}$, $d_0 = d_1 = 1000$Å.

In this case, $|\xi_2| = 1.4.10^7$ V.m$^{-1}$, which can be attained from the dual inequality (6) and necessitates, with $x = x' = 0.3$ and without spacers, a doping level $n_D = 4.10^{17}$ at.cm$^{-3}$. The equation (7) then gives $d_{2opt} = 250$Å and the equation (8) enables the computation of the transconductance common to both channels:

$$gm = 60mS.mm^{-1} \text{ (with } v_{Ln} \simeq 10^5 m.sec^{-1}\text{)}.$$

This computation is given only by way of indication and, of course, other higher transconductance values and other characteristics are possible with other design values for the transistor.

Figure 6:
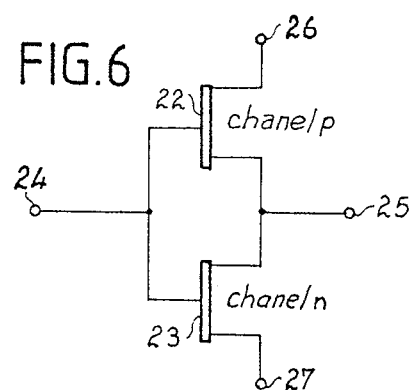
FIG. 6 is an electrical diagram of a complementary logic circuit.

Another example of an application of the double heterojunction transistor according to the invention is found in complementary logic. The basic cell of the complementary logic circuit is recalled in FIG. 6. Two transistors 22 and 23, one with a p channel and the other with an n channel, are driven by a signal applied simultaneously to both their gates. The signal enters at the common point 24 and goes out at the common point 25. These same two transistors are powered in series between two voltage terminals 26 and 27. Complementary MOS silicon transistors are frequently used for this type of logic and, depending on its polarity, the signal opens the n channel or the p channel.

The double heterojunction transistor according to the invention can also be used in complementary logic because it has two different channels. However, in an integrated circuit comprising, for example, several such transistors, it is necessary, before depositing the source and drain contacts 10 and 11, to select the desired type of conduction (n or p) by implanting n$^+$ or p$^+$ pads respectively to reduce the access resistances.

The usefulness of this approach as compared with known approaches lies in the possibility of giving symmetry to the two types of operation and thus achieving almost perfect complementarity with a transistors of single type on the integrated circuit chip, certain transistors working in n channel mode and others working in p channel mode.

For this application, each of the two transistors (the one using the n channel and the one using the p channel) should be normally off and should therefore work in enhancement mode which implies, for the proposed transistor, the following inequalities:

$$V_{Tn} > 0 \text{ and } V_{Tp} < 0$$

the complementarity further imposes:

$$V_{Tn} = |V_{Tp}| = V_T \text{ and}$$

$$d_0 \simeq d_1$$

which implies $$V_o \simeq 2E_g - V_T$$

$$|\xi_2| \simeq \frac{E_g - V_T}{d_o} = \frac{E_g - V_T}{d_1}$$

whence $$V_{pl} = \frac{qn_A d_1^2}{2\epsilon} = 2E_g\,Ga\,As - \phi_n + \Delta E_c - V_T$$

$$d_1 = \frac{E_g\,Ga\,As - V_T}{|\xi_2|}$$

The transconductance common to the two transistors is then given by the expression:

$$gm = \frac{\epsilon Z v_{Ln}}{2 d_1}$$

As an application let us choose $x=x'=x''=0.3$ (which leads to $\Delta E_c \simeq 0.3$ and $\phi_n \simeq 1$) and $V_T=0.5$ volts as well as $$gm = 150 ms.mm^{-1}.$$

The literature on the subject gives $v_{Ln}=10^5$ m.sec$^{-1}$. On this basis, computation gives:

$$d_0 = d_1 \simeq 400 \text{Å}$$

$V_{pl}=1.6$ V which can be achieved for $n_A \simeq 1.5.10^{18}$ at.cm$^{-3}$ $$|\xi 2| = 2.25.10^7 V.m^{-1}.$$

The choice of a high transconductance leads to an electrical field $|\xi 2|$ which is itself high, but which can be achieved without spacers since it requires a doping of the n AlGaAs layer 4 of:

$$n_D \simeq 1.5.10^{18} at.cm^{-3}$$

which is a value currently used for the n AlGaAs layers of TEGFETs.

Of course, other approaches are possible for choices of different values.

Figure 7:
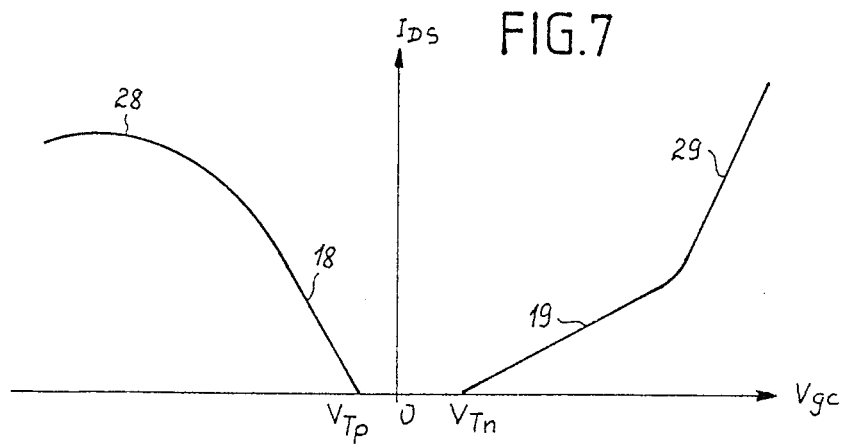
FIG. 7 shows the limitation of linearity as a function of the gate/channel voltage.

Strictly speaking, the double heterojunction transistor according to the invention operates in concordance with the above-mentioned equations only in a limited range of gate-channel voltage $V_{gc}$. For (and FIG. 7 shows this), the modelling provides that:

for sufficiently negative voltages $V_{gc}$, there is a loss of control of the p channel which corresponds to the part 28 of the transconductance layer of FIG. 7, for sufficiently positive voltages $V_{gc}$, there is an opening of a second n channel at 29 with a higher transconductance than that of the first channel at 19.

However, these extreme voltages $V_{gc}$ are located outside the range of voltages commonly used with microwave transistors.

Of course, just as it was stated earlier that it had been chosen to explain the invention by using an example of a GaAs-AlGaAs transistor, without any restriction on the scope of the invention, those skilled in the art could easily re-establish the equations in considering the electrical field $\xi 1$ at the interface 1 rather than the electrical field $\xi 2$ at the interface 2. The choice that has been made is based on the advantage of the structure of FIG. 1 in providing symmetry to the characteristics of the two n and p channels. But an inverse structure (with the n channel close to the gate and the p channel at a distance from the gate) could, on the contrary, in certain cases, be useful, for example in order to have an n channel with a transconductance which is appreciably higher than the transconductance of the p channel.

More generally, the invention concerns a double heterojunction transistor between semi-conducting materials with a small forbidden gap and a big forbidden gap, doped so as to create two two-dimensional gas conducting channels, one of the n type (2DEG) and the other of the p type (2DHG), which exist simultaneously or alternately depending on the voltage applied to the gate of the microwave transistor, as specified by the following claims.

What is claimed is:

1. A double heterojunction microwave transistor comprising an active region, controlled by a Schottky gate electrode, supported by a substrate made of semi-insulating or non-intentionally doped semi-conducting materials, said transistor being characterized in that the active region comprises first, second and third superimposed layers, said second layer having a thickness of at least 400 Angstroms being an intermediate layer being made of a semi-conducting material, non-intentionally doped to a level of $n<10^{15}$ at.cm$^{-3}$ with a narrow forbidden gap, said first and third layers being adjacent layers to the intermediate layer and made of semi-conducting material with a wider forbidden gap than that of the intermediate layer, said first layer being one of said adjacent layers and being n type doped to a level of $n_D>10^{17}$ at.cm$^{-3}$ and said third layer being the other adjacent layer and being p type doped to a level of $n_A>10^{17}$ at.cm$^{-3}$, this first layer and third layer thus forming two heterojunctions at their interfaces with the intermediate second layer so that a two-dimensional electron gas is formed at the interface between the n doped first layer and the non-intentionally doped second layer and a two-dimensional hole gas is formed at the interface between the non-intentionally doped second layer and the p doped third layer, said transistor being thus provided with two potential conducting channels, one channel of the n type due to the two-dimensional electron gas and the other channel of the p type due to the two-dimensional hole gas, said transistor comprising, in addition to said gate electrode, a source and drain electrode metallization formed on said third layer to provide source and drain regions with said potential conducting channels being in parallel between said source and drain regions.

2. A transistor according to claim 1 made of materials of the III-V group, the layers with a narrow forbidden gap and with a wide forbidden gap being chosen from among the binary, ternary or quaternary alloys of Ga, As, Al, In, P, Sb, such as GaAs, Al$_x$Ga$_{l-x}$As, Inp, Ga$_x$In$_{l-x}$As.

3. A transistor according to claim 1 wherein the first n doped layer of material with a wide forbidden gap is located between the substrate and the intermediate second layer with a narrow forbidden gap, and wherein the third p doped layer of material with a wider forbidden gap is located between the intermediate second layer and the gate electrode so that the two-dimensional electron gas is further away from the gate than the two-dimensional hole gas.

4. A transistor according to claim 3 wherein the threshold voltages $V_{Tn}$ for the n channel and $V_{Tp}$ for the p channel are given by:

$$V_{Tn} \simeq \phi_n - \Delta E_c + V_{pl} - |\xi 2|(d_0+d_1)$$

and $$V_{Tp} \simeq \phi_n - \Delta E_c + V_{pl} - E_g\left(1 + \frac{d_1}{d_o}\right)$$

and wherein the electrical charge control sensitivities in the n channel and in the p channel are respectively given by:

$$\frac{dn_s}{dV_{gc}} \simeq \frac{\epsilon}{q(d_o + d_1)}$$

and $$\frac{dp_s}{dV_{gc}} \simeq -\frac{\epsilon}{q\, d_1}$$

expression wherein:
- $\phi_N$ is the height of semi-conductor/metal barrier, for the electrons, at the gate/p-doped third layer interface,
- $\Delta E_c$ is the energy discontinuity of the conduction band at the two heterojunctions
- $V_{pl}$ is the penetration voltage.
- $|\xi 2|$ is the absolute value of the electrical field at the interface between the first layer and the second layer
- $d_0$ and $d_1$ are the thicknesses, respectively, of the second and third layers,
- $E_g$ is the width of the forbidden gap of the second layer,
- $n_s$ is the electron surface density in the n channel,
- $p_s$ is the hole surface density in the p channel,
- $V_{gc}$ is the gate-channel voltage for a considered channel,
- $\epsilon$ is the dielectrical permittivity of the semiconducting material,
- $q$ is the electron charge.

5. A transistor according to claim 4 wherein if $V_{Tn} < V_{Tp}$, the transistor is conductive by the p channel for a gate-channel voltage $V_{gc} < V_{Tp}$ and it is conductive by the n channel for a voltage $V_{gc} > V_{Tp}$, and is off for $V_{Tp} > V_{gc} > V_{Tn}$.

6. A transistor according to claim 4 wherein if $V_{Tn} < V_{Tp}$, the transistor is conductive by the p channel for a gate-channel voltage $V_{gc} < V_{Tp}$ and it is conductive by the n channel for a voltage $V_{gc} > V_{Tp}$, the n channel being not controlled for $V_{gc} < V_{Tp}$.

7. A transistor according to claim 4 wherein, the transconductance of a channel being proportionate to the limit speed $v_L$ of the electrical charge carriers in this channel, and the limit speed $v_{Ln}$ of the electrons in the n channel being greater than the limit speed $V_{Lp}$ of the holes in the p channel, the transconductance values of the two channels, n and p, are made equal by giving the p doped and non-intentionally doped layers respective thickness $d_1$ and $d_0$ linked by the relationship:

$$\frac{d_o}{d_1} = \frac{v_{Ln}}{v_{Lp}} - 1,$$

the characteristic of the two channels of the transistor being thus made symmetrical.

8. A transistor according to claim 7 wherein, $d_2$ being the thickness of the n doped layer, this layer is totally depleted for an optimal thickness $$d_{2opt.} \simeq \frac{\epsilon |\xi 2|}{q\, n_D}.$$

9. A transistor according to claim 4 constituting a frequency doubler of an alternating signal applied to its gate where the threshold voltages $V_{Tn}$ and $V_{Tp}$ of its two channels, n and p, are equal to zero, i.e.:

$$|\xi 2| \simeq \frac{E_g}{d_o}.$$

10. A transistor according to claim 4 constituting a transistor with two normally off complementary channels n and p where:

$$V_{Tn} = |V_{Tp}| = V_T$$

$$d_1 = \frac{E_g - V_T}{|\xi 2|}$$

where $V_T$ is the device threshold voltage.

* * * * *